US009456524B2

(12) United States Patent
Ohfuchi (10) Patent No.: US 9,456,524 B2
(45) Date of Patent: Sep. 27, 2016

(54) ROBOT CONTROLLER ENCLOSURE (71) Applicant: KABUSHIKI KAISHA YASKAWA DENKI, Kitakyushu-shi (JP)

(72) Inventor: Yoshitaka Ohfuchi, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 400 days.

(21) Appl. No.: 13/954,983

(22) Filed: Jul. 31, 2013

(65) Prior Publication Data

US 2014/0285984 A1 Sep. 25, 2014

(30) Foreign Application Priority Data

Mar. 19, 2013 (JP) .................................. 2013-057288

(51) Int. Cl.
H05K 5/02 (2006.01)
H05K 7/20 (2006.01)
H04Q 1/02 (2006.01)

(52) U.S. Cl.
CPC ............ H05K 7/20127 (2013.01); H04Q 1/02 (2013.01); H05K 5/0247 (2013.01)

(58) Field of Classification Search
None
See application file for complete search history.

(56) References Cited

U.S. PATENT DOCUMENTS

| 5,608,299 | A | * | 3/1997 | Hashimoto | ............. | B25J 13/00 318/568.11 |
| 5,654,870 | A | * | 8/1997 | Havener | ............. | H01M 2/1055 248/27.3 |
| 5,659,151 | A | | 8/1997 | Dale | | |
| 5,986,889 | A | * | 11/1999 | Chang | ................. | H05K 7/1421 361/679.41 |
| 6,274,812 | B1 | | 8/2001 | Daoud | | |
| 6,310,777 | B1 | * | 10/2001 | Knott | .................. | G11B 33/126 361/679.37 |
| 7,808,793 | B2 | * | 10/2010 | Nagao | ....................... | G06F 1/16 312/223.1 |
| 8,608,207 | B2 | * | 12/2013 | Boraas | .................... | F16L 37/23 285/124.3 |
| 8,935,844 | B2 | * | 1/2015 | Ramgattie | ............... | H02G 9/02 174/135 |
| 2003/0002261 | A1 | * | 1/2003 | Berry | .................. | H05K 7/1489 361/727 |
| 2003/0093183 | A1 | * | 5/2003 | Bunn | ............... | G05B 19/41805 700/259 |

(Continued)

FOREIGN PATENT DOCUMENTS

| JP | 60-26161 U | 2/1985 |
| JP | 61-236481 | 10/1986 |
| JP | 2002-135916 | 5/2002 |

OTHER PUBLICATIONS

Extended European Search Report for corresponding EP Application No. 13185472.1-1851, Jul. 25, 2014.

(Continued)

*Primary Examiner* — Xanthia C Cunningham
(74) *Attorney, Agent, or Firm* — Mori & Ward, LLP (57) ABSTRACT

An enclosure according to an embodiment includes an internal space, an opening, a connector base, and a relay cable. A robot controller is accommodated in the internal space. The opening is formed in an external wall having predetermined environmental resistance. The connector base includes a first connector for connecting an external cable for the robot controller and can be pulled out of the enclosure. The relay cable connects a connector of the robot controller and the first connector. The relay cable has a length that allows a connecting part between the first connector and the external cable to be exposed outside the external wall when the connector base is pulled out.

10 Claims, 6 Drawing Sheets

(56) References Cited

U.S. PATENT DOCUMENTS

| | | | |
|---|---|---|---|
| 2006/0219426 A1 | 10/2006 | Holmberg et al. | |
| 2007/0120513 A1* | 5/2007 | Tanaka | B25J 9/1602 318/568.11 |
| 2008/0144293 A1* | 6/2008 | Aksamit | H05K 7/1489 361/727 |
| 2009/0086441 A1* | 4/2009 | Randall | H05K 7/1492 361/724 |
| 2010/0000758 A1 | 1/2010 | Bravo et al. | |
| 2010/0132979 A1* | 6/2010 | Chen | H02G 3/32 174/135 |
| 2010/0156253 A1* | 6/2010 | Ohfuchi | H05K 7/1467 312/201 |
| 2011/0180319 A1* | 7/2011 | Nagata | F16J 15/106 174/668 |
| 2011/0228496 A1* | 9/2011 | Huang | G06F 1/183 361/752 |
| 2011/0288684 A1* | 11/2011 | Farlow | B25J 11/009 700/264 |
| 2012/0130541 A1* | 5/2012 | Szalek | B25J 9/106 700/258 |
| 2012/0188725 A1* | 7/2012 | Masuda | H05K 7/1491 361/724 |
| 2013/0073092 A1* | 3/2013 | Hosek | B25J 13/00 700/264 |
| 2014/0087072 A1* | 3/2014 | Kester | C23C 14/50 427/248.1 |
| 2014/0126158 A1* | 5/2014 | Baran | H01H 71/08 361/729 |

OTHER PUBLICATIONS

Japanese Office Action for corresponding JP Application No. 2013-057288, Sep. 30, 2014.

Chinese Office Action for corresponding CN Application No. 201310481365.6, Apr. 25, 2016.

* cited by examiner

ROBOT CONTROLLER ENCLOSURE

CROSS-REFERENCE TO RELATED APPLICATION

This application is based upon and claims the benefit of priority of the prior Japanese Patent Application No. 2013-057288, filed on Mar. 19, 2013, the entire contents of which are incorporated herein by reference.

FIELD

The embodiment discussed herein is directed to an enclosure.

BACKGROUND

Robots have been applied to various industrial uses and in particular frequently used in place of workers in adverse environments rich in dust, motes, oil mist, or the like. In such environments, in order to prevent short-circuit or the like in electronic components caused by the adhesion of dust, motes, oil mist, or the like, a robot controller is generally incorporated in a totally enclosed enclosure for use being isolated from the above-described ambient environments.

The temperature inside the enclosure incorporating the robot controller is increased by heat generation from a number of electronic components used in the robot controller. Given this situation, the inside of the enclosure incorporating the robot controller is generally cooled to maintain the temperature of the robot controller within a guaranteed operation range. An enclosure that includes a cooling device and isolates a controller from an ambient environment to cool it is disclosed in, for example, Japanese Patent Application Laid-open No. 2002-135916.

However, when a cooling device and a robot controller are incorporated in an enclosure, the internal space of the enclosure is narrow, and the internal space itself has a complex shape. This leads to poor workability when an external cable from a robot or the like is connected to the robot controller incorporated in the enclosure, requiring tools in some cases. Even when no cooling device is incorporated in the enclosure, workability remains poor.

SUMMARY

An enclosure according to an embodiment includes an internal space, an opening, a connector base, and a relay cable. A robot controller is accommodated in the internal space. The opening is formed in an external wall having predetermined environmental resistance. The connector base includes a first connector for connecting an external cable for the robot controller and can be pulled out of the enclosure. The relay cable connects a connector of the robot controller and the first connector. The relay cable has a length that allows a connecting part between the first connector and the external cable to be exposed outside the external wall when the connector base is pulled out.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

With reference to the attached drawings, an embodiment of the enclosure disclosed by the present application will be described in detail. This invention is not limited by the embodiment below.

Figure 1:
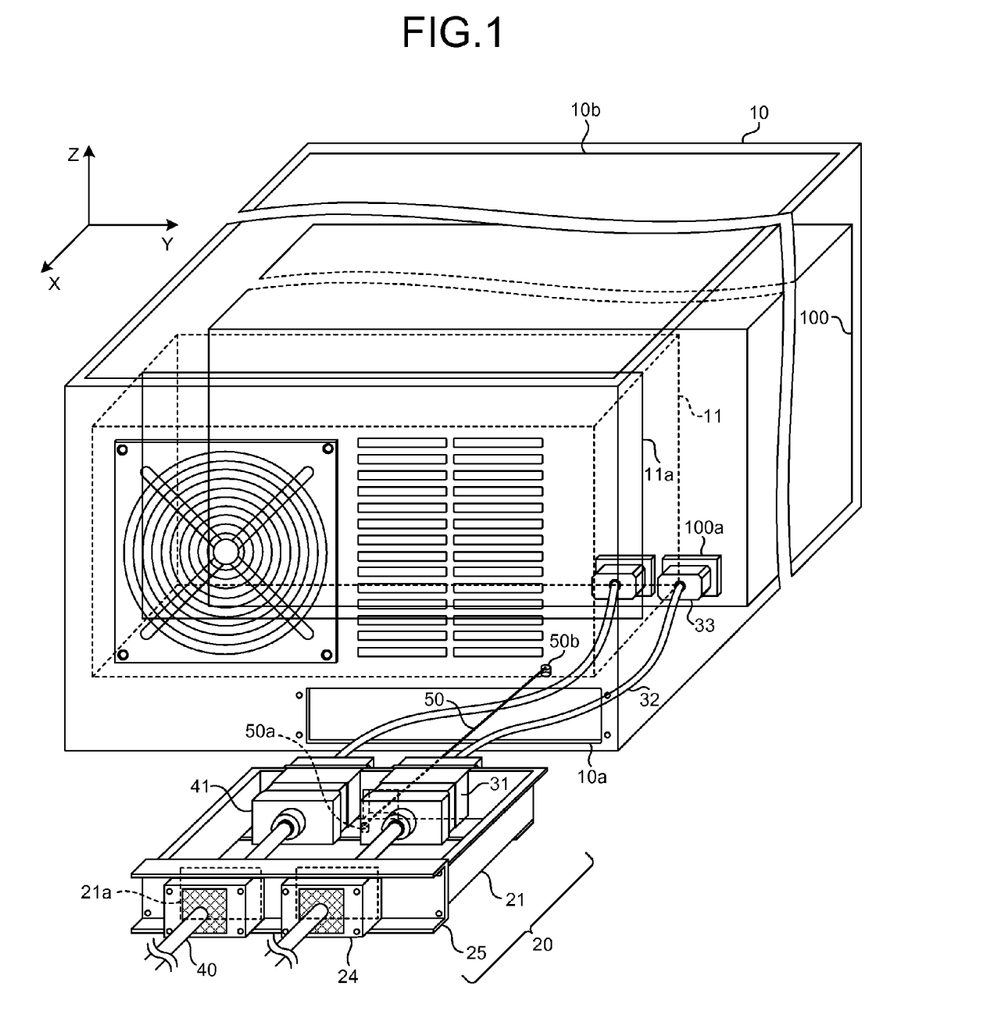
FIG. 1 is a perspective view of an enclosure according to an embodiment.

First, an enclosure according to the embodiment will be described with reference to FIG. 1. FIG. 1 is a perspective view of an enclosure 10 according to the embodiment. In view of making the description easy to understand, FIG. 1 illustrates the enclosure 10 with part of an external wall thereof made transparent. The following description is based on the assumption that the pull-out direction of a connector base 20 is the positive X-axis direction in the XYZ coordinate system illustrated in FIG. 1.

As illustrated in FIG. 1, the enclosure 10 has, for example, a rectangular parallelepiped shape and has the internal space isolated from the external space by the external wall having predetermined environmental resistance. The external wall is an example of an accommodating means. The above-described "predetermined environmental resistance" is represented by, for example, "IP54." The International Protection (IP) Standard includes standards for the strength of environmental resistance standardized by the International Electrotechnical Commission (IEC). An IP rating is denoted by two signs, that is, "IP (the first sign) (the second sign)."

The first sign represents a protection rating of electric equipment and cabinets against solid foreign matters, which is represented by seven ratings from "0", which means no protection against dust entry, to "6", which means no dust entry inside. The second sign represents a protection rating against water entry, which is represented by nine ratings from "0", which means no protection against water entry, to "8", which means the optimum resistance. When no rating is determined, "X" is denoted.

The "IP54" means that, for electric equipment and cabinets, dust enough to inhibit the normal operation and safety of the equipment does not enter the inside thereof and that there is no adverse effect thereon by splashes of water from various directions. The "IP2X" means that a spherical test particle having a diameter of 12.5 mm, which is about the thickness of a finger, enters the inside thereof only partially and that no protection rating is determined for water entry.

The enclosure 10 according to the present embodiment can improve, for example, a low protection rating of "IP2X" of a robot controller 100 to a higher protection rating, such as "IP54", substantially. By changing a sealing member such as packing, a further higher protection rating such as "IP65" and "IP67" can be achieved.

As illustrated in FIG. 1, a heat exchanger 11 and the robot controller 100 are accommodated in the internal space of the enclosure 10. An opening 10a is formed in part of the external wall of the enclosure 10. The opening 10a is an example of a communicating means. The opening 10a is formed at a position opposite a connector 100a of the robot controller 100. The connector base 20 of the pull-out type having a shape that closes the opening 10a in a retracted state is provided on the opening 10a. The connector base 20 is an example of a closing means. The enclosure 10 includes a removable top plate 10b on a surface different from the surface on which the opening 10a is formed, and devices including the robot controller 100 are put in and taken out with the top plate 10b removed.

The heat exchanger 11 is a device that performs heat exchange between the external space and the internal space of the enclosure 10 while isolating both spaces from each other. The heat exchanger 11 maintains the temperature inside the enclosure 10 that is increased by heat generated from the robot controller 100, at a temperature within a guaranteed operation range by, for example, cooling the inside of the enclosure 10.

Specifically, the heat exchanger 11 includes therein a partition 11a isolating a space within the heat exchanger 11 that communicates with the inside of the enclosure 10 from a space that communicates with the outside of the enclosure 10. The heat exchanger 11 thus includes the partition 11a, thereby performing temperature control within the enclosure 10 while the inflow of oil mist or dust into the inside of the enclosure 10 is cut off.

The robot controller 100 is a device that controls the motion of a robot (not illustrated). As illustrated in FIG. 1, the robot controller 100 includes a connector 100a to be attached to cables that perform electric supply to the robot and signal transmission and reception with the robot. Although two connectors 100a are illustrated in FIG. 1, the number of connectors 100a is not limited.

The connector base 20 includes a body 21 and a lid 25. The lid 25 is an example of a lid means. The body 21 is a nearly rectangular shaped frame body having a hollow part formed through the direction of the Z-axis drawn in FIG. 1. The body 21 thus has the hollow part formed through a direction parallel to the Z-axis, thereby not hindering the flow of air convecting within the enclosure 10.

As illustrated in FIG. 1, the same number of relay connectors 31 as the connectors 100a are provided on a surface closer to the robot controller 100, of the body 21 of the connector base 20. The lid 25 is provided on a surface opposite the surface on which the relay connectors 31 are provided.

One surface of each of the relay connectors 31 (the negative X-axis direction side) is connected by a relay cable 32 to the corresponding connector 100a of the robot controller 100. The relay cable 32 is an example of a relaying means. The relay cable 32 and the connector 100a of the robot controller 100 are connected through a connector 33 of the relay cable 32. The connector 33 is, for example, connected to the robot controller 100 with the top plate 10b removed. The shape of the connecting part between the relay cable 32 and the connector 33 illustrated in the drawing is merely an example.

A connector 41 of an external cable 40 is connected to the other surface (the positive X-axis side) of the relay connector 31. The external cable 40 is a cable that is originally connected to the connector 100a of the robot controller 100, that is, a cable for the robot controller 100. In other words, the connector 41 is a connector adaptable to the connector 100a of the robot controller 100.

The length of the relay cable 32 is adjusted to allow the connecting part between the connector 41 of the external cable 40 and the relay connector 31 to be exposed outside the enclosure 10 when the connector base 20 is pulled out of the enclosure 10. The external cable 40 can be thus connected and disconnected easily. Furthermore, as described above, because the body 21 of the connector base 20 includes the hallow part formed through the direction of in the Z-axis, such operations are further facilitated.

As illustrated in FIG. 1, the same number of openings 21a as the external cables 40 are provided on the lid 25. Each of the openings 21a has a size that allows the connector 41 to pass therethrough. The external cable 40 is inserted into the inside of the frame-like body 21 through the opening 21a.

A cable fixture 24 is attached to the external cable 40 with the connector 41 inserted into the inside of the body 21, and the cable fixture 24 is attached to the opening 21a in the negative X-axis direction. The gap between the external cable 40 and the lid 25 of the connector base 20 is thus closely and reliably sealed up.

The cable fixture 24 is preferably attached to a position such that the external cable 40 does not bend within the frame-like body 21. As the cable fixture 24, a bushing, a grommet, which will be described later, or the like may be used.

The relay cable 32 is, for example, a cable formed by bundling a plurality of cables and covering them with a covering member such as a heat-shrinkable tube. The connector 33 and the connector 41 have, for example, a disconnection-proof structure such as a latch structure, which prevents their disconnection caused by vibrations or the like.

The connector base 20 and the enclosure 10 are connected by a ground wire 50. Specifically, the ground wire 50 is connected to a fixture 50a provided in the connector base 20 and a fixture 50b provided on the internal surface of the external wall of the enclosure 10.

The ground wire 50 connects the external wall of the enclosure 10 and the connector base 20 electrically, thereby playing a role of preventing an electric shock when an operator touches the connector base 20. Although the fixture 50a and the fixture 50b are not limited in their shapes as long as they provide electric connection, screws are preferable in view of strength and operational convenience.

In the enclosure 10 according to the present embodiment, the length of the ground wire 50 is set to be an appropriate length, thereby avoiding load on the relay cable 32 when the connector base 20 is pulled out.

In other words, as illustrated in FIG. 1, the length of the ground wire 50 is adjusted to, when the ground wire 50 is fully stretched, allow the connecting part between the connector 41 of the external cable 40 and the relay connector 31 to be exposed outside the enclosure 10 to prevent the relay cable 32 from being fully stretched.

Thus, the connector base 20 is prevented from being exceedingly pulled out, thereby surely preventing a break in the relay cable 32 and the disconnection of the relay connector 31. The ground wire 50, which plays a role of electric shock prevention, reduces cost too by being used as a restricting member for the pull-out amount of the connector base 20.

Once connected to the connector 41, the connector base 20 is inserted into the inside of the enclosure 10 through the opening 10a of the enclosure 10 and fixed thereto. The relay cable 32 and the ground wire 50 are housed within the enclosure 10 along with the insertion of the connector base 20.

The enclosure 10 incorporating the robot controller 100 thus includes the pull-out connector base 20 having a shape closing the opening 10a of the enclosure 10 in the retracted state. The connector base 20 includes the relay connector 31 to which the external cable 40 for the robot controller 100 is connected. The relay connector 31 is connected to the connector 100a of the robot controller 100 through the relay cable 32.

By using the enclosure 10, thus, it is only need to connect the external cable 40, which is originally connected to the connector 100a of the robot controller 100, to the relay connector 31 of the pull-out connector base 20. The connector base 20 being pulled out of the enclosure 10 allows connection and disconnection of the external cable 40 while viewing the relay connector 31. Although FIG. 1 illustrates a case where the enclosure 10 is horizontally installed, the installation direction of the enclosure 10 is not limited to the one illustrated in FIG. 1.

The function of the heat exchanger 11 is not limited to cooling and the heat exchanger 11 may be a device having a function of maintaining the temperature inside the enclosure 10 constant. In an environment where the temperature of the robot controller 100 falls under the guaranteed operation range, for example, in cold climate areas or the like, it may be a heating device. When the temperature control of the robot controller 100 is unnecessary, the heat exchanger 11 may be omitted.

The shapes of the enclosure 10, the robot controller 100, and the heat exchanger 11 may not be limited to a rectangular parallelepiped. Each of the robot controller 100, the heat exchanger 11, and the connector base 20 may be provided plurally. The position relation between the surface of the robot controller 100 on which the connector 100a is provided and the relay connector 31 is not limited to opposite positions.

The numbers and positions of the top plate 10b, the connector base 20, and the opening 10a may be appropriately changed according to the numbers and positions of the enclosure 10, the robot controller 100, and the heat exchanger 11. The opening 10a may be formed in the top plate 10b. The relay cable 32 is not limited to a covered cable, and the number of relay cables 32 may be appropriately changed according to the numbers and shapes of the relay connector 31 and the connectors 100a. The ground wire 50 may be provided plurally for the respective connector bases 20.

The enclosure 10 illustrated in FIG. 1 has a sealed structure with a packing or the like on the contact surface between the removable top plate 10b and the enclosure 10.

Figure 2A:
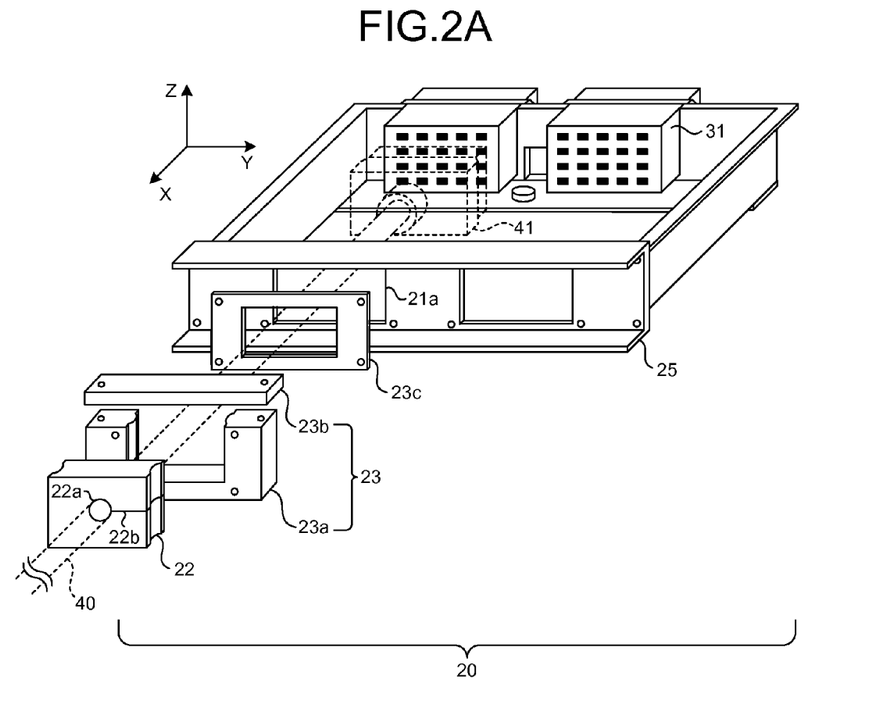
FIG. 2A is a perspective view when a connector base is viewed from the front side.
Figure 2B:
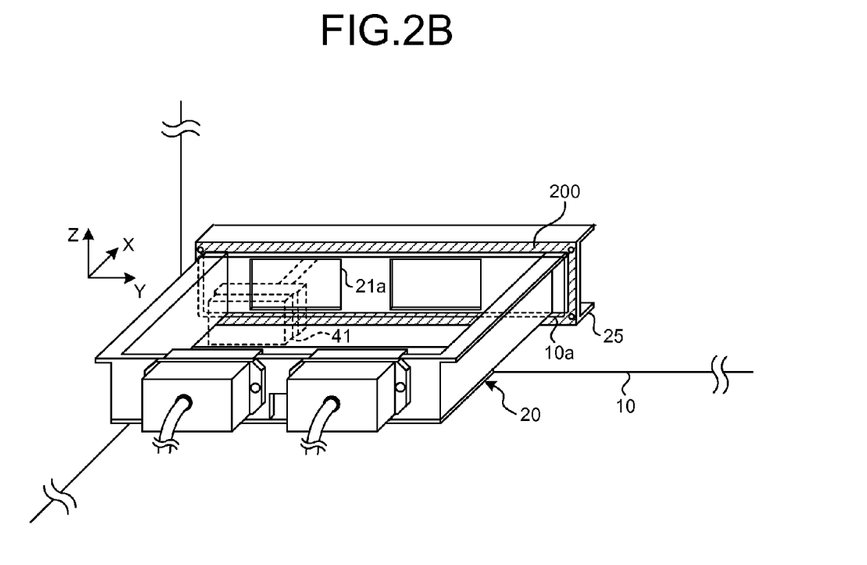
FIG. 2B is a perspective view when the connector base is viewed from the rear side.

Next, the detailed structure of the connector base 20 will be described with reference to FIG. 2A and FIG. 2B. FIG. 2A is a perspective view when the connector base 20 is viewed from the front side, and FIG. 2B is a perspective view when it is viewed from the rear side. The shape of the connecting part of the relay connector 31 illustrated in FIG. 2A and the shape of the rear surface of the relay connector 31 illustrated in FIG. 2B are merely examples.

As illustrated in FIG. 2A, the connector base 20 includes the opening 21a in the lid 25. The opening 21a has a size allowing the connector 41 to pass therethrough. The connector base 20 includes a cable fixture 22, a cable fixture frame 23, and a packing 23c, which are first sealing members, and ensures sealability of an area where the external cable 40 passes through the lid 25. The first sealing members are examples of a first sealing means. Specifically, the cable fixture 22 is formed of an elastic material such as rubber and synthetic resin and has a through hole 22a whose diameter is slightly smaller than the cross section of the external cable 40 in the central part of its rectangular parallelepiped shape.

The cable fixture 22 includes a pair of recesses on facing surfaces out of surfaces not including the through hole 22a and includes a slit 22b that connects one of the surfaces including a recess and the through hole 22a. The external cable 40 is fitted to the through hole 22a by allowing the external cable 40 to spread out the slit 22b and pass therethrough. The reason why the diameter of the through hole 22a is slightly smaller than the diameter of the external cable 40 is based on the expectation of a sealing effect by compression, which will be described later.

As the cable fixture 22 and the cable fixture frame 23, for example, a grommet may be used. The cable fixture 22 to which the external cable 40 is fitted is attached to the cable fixture frame 23. The cable fixture frame 23 has a nearly rectangular frame body and includes a hollow part to which the cable fixture 22 is attached with the surface having the through hole 22a allowed to pass, and its frame part tightly covers the entire perimeter of the opening 21a. The cable fixture frame 23 includes two parts of a fitting part 23a and a pressing part 23b.

The fitting part 23a is U-shaped and has protrusions corresponding to the recesses of the cable fixture 22, on the two facing surfaces adjacent to the hollow part. The pressing part 23b is plate-like and is press-fixed to the fitting part 23a by screws or the like. The material of the cable fixture frame 23 may be any material having heat resistance, corrosion resistance, and moderate strength and is preferably synthetic resin such as polyamide in view of ease of working and cost.

The cable fixture 22 is attached to the fitting part 23a by being pressed in the negative Z-axis direction in the drawing with the protrusions and recesses fitted to each other. Because the part of the fitting part 23a in which the cable fixture 22 is housed is slightly smaller than the cable fixture 22, the cable fixture 22 is attached to the fitting part 23a in a compressed state.

The part of the cable fixture 22 that is not housed within the fitting part 23a and protrudes in the Z-axis direction in the drawing is compressed by the pressing part 23b to be housed within the cable fixture frame 23. Because a force acts isotropically on the YZ-plane in the drawing in a state where the cable fixture 22 is compressed to be housed within the cable fixture frame 23, the contact surface between the external cable 40 and the cable fixture 22 and the contact surface between the cable fixture 22 and the cable fixture frame 23 are closely sealed up.

The cable fixture frame 23 thus assembled is attached to the lid 25 in the negative X-axis direction in the drawing, covering the opening 21a with the packing 23c interposed therebetween. The contact surface between the cable fixture frame 23 and the lid 25 is thereby closely sealed up. As described above, it is preferable that the cable fixture 22 or the like is attached to a position such that the external cable 40 does not bend within the nearly rectangular frame body of the body 21.

As the material of the packing 23c, general rubber and synthetic resin may be used. The sealing part may have, not only a structure with the inserted packing, but also an O-ring sealed structure using the same material as the packing. The same applies to the packing below.

As illustrated in FIG. 2B, the connector base 20 includes a second sealing member in an area 200 in which the lid 25 is in close contact with the perimeter of the opening 10a, where the second sealing member is, for example, a packing having the same shape as the area 200. The second sealing member is an example of a second sealing means. The lid 25 is fastened to the enclosure 10 through the packing, thereby sealing the area 200.

In order to ensure the sealability of the area 200, the lid 25 is preferably strong enough to cause no strain even under a reaction force from the packing when press-fixed to the enclosure 10. For this reason, the lid 25 is formed by bending both long sides of a rectangular metallic plate in the same direction along a line by a certain distance from the sides. This improves the planarity of the area 200 while ensuring workability and low cost.

The lid 25 thus formed into the shape with both ends bent has the opening 21a between the bent parts. This allows the pair of the bent parts to play a role of a guide, facilitating an operation for inserting the connector 41 into the opening 21a.

As illustrated in FIG. 2B, the underside of the lid 25 is positioned lower than the underside of the body 21. Then, when the connector base 20 is placed on a flat surface, the connector base 20 is stable with a gap produced between the connector base 20 and the surface. This facilitates a connection operation of the connector 41. The lid 25 is preferably fixed to the enclosure 10 with screws at several points, preferably four points, in view of reliable sealability and operational convenience.

Figure 3:
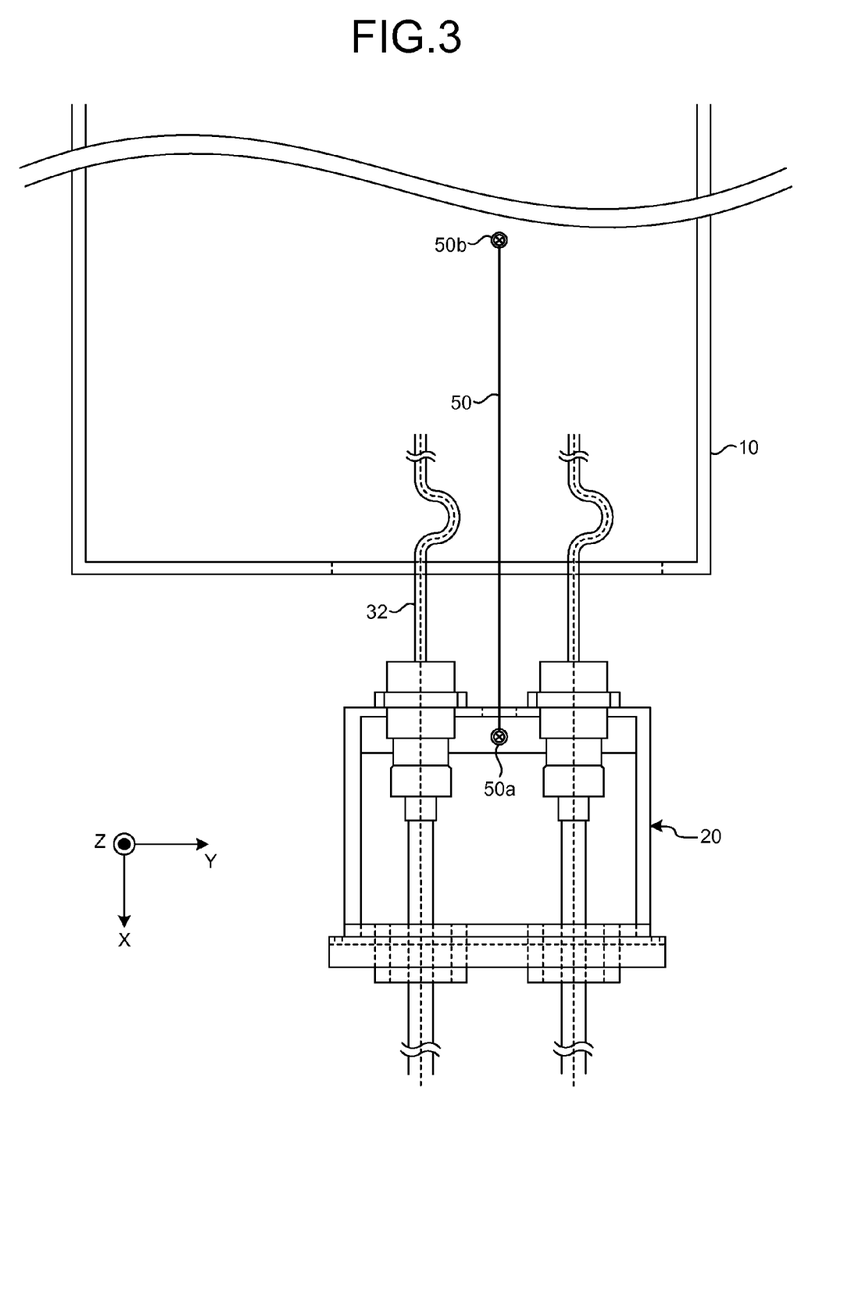
FIG. 3 is a top view illustrating an arrangement example of a ground wire.

Next, an arrangement example of the ground wire 50 will be described with reference to FIG. 3. FIG. 3 is a top view illustrating an arrangement example of the ground wire 50. FIG. 3 illustrates a state where the connector base 20 is pulled out of the enclosure 10. As illustrated in FIG. 3, the ground wire 50 is fixed to the connector base 20 and the enclosure 10 with the fixtures 50a and 50b, respectively, and connects the two mechanically and electrically.

As illustrated in FIG. 3, the ground wire 50 is fixed near the center of the connector base 20 in the Y-axis direction in the drawing. Thus, when a single ground wire 50 is used, the ground wire 50 is preferably fixed near the center of the connector base 20 in the Y-axis direction. By doing so, an attitude change of the pulled-out connector base 20 can be reduced, preventing only one relay cable 32 from being pulled.

The ground wire 50 is not limited in its material as long as it is a less elastic material. For example, as the ground wire 50, a general covered wire with a multicore copper wire as a core material and with polyethylene or polyvinyl chloride as a covering material may be used. The fixtures 50a and 50b may be any members that fix the ground wire 50, and, for example, screws may be used.

The ground wire 50 is in a slack state, together with the relay cable 32, within the enclosure 10 when the connector base 20 is retracted, and is pulled out when the connector base 20 is pulled out. The connector base 20 is pulled out until the ground wire 50 is fully stretched. As illustrated in FIG. 3, the relay cable 32 remains slack even when the ground wire 50 is fully stretched.

Figure 4:
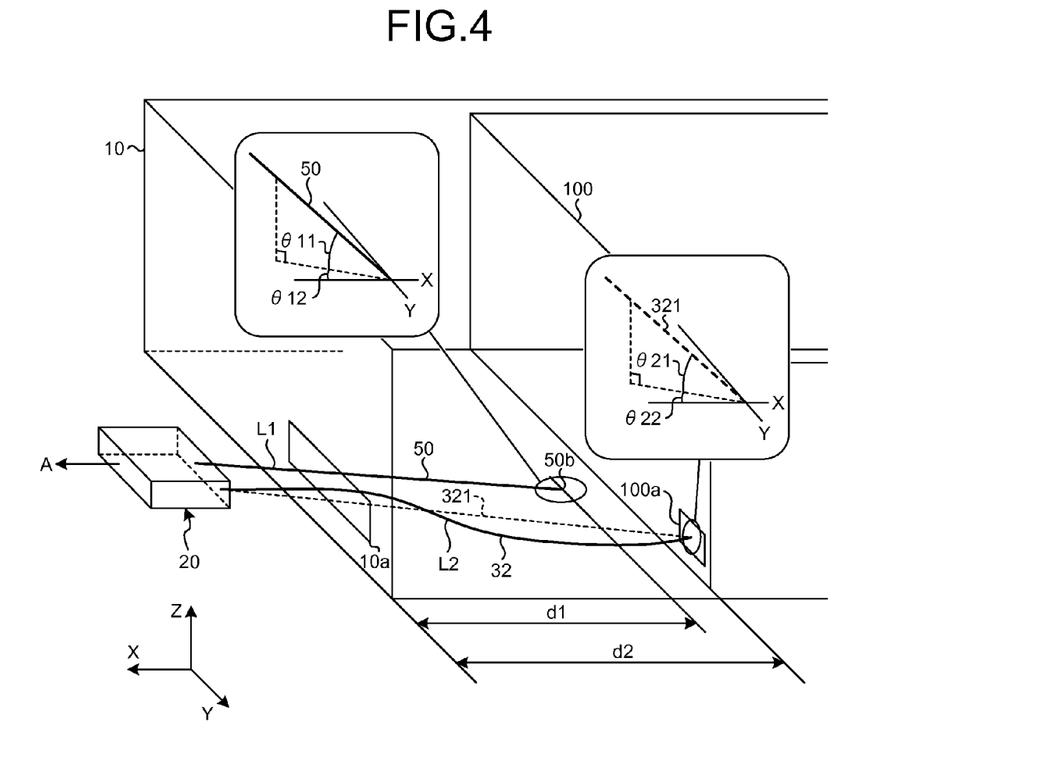
FIG. 4 is a diagram illustrating the position relation among the ground wire and the others parts.

FIG. 4 is a diagram illustrating the position relation among the ground wire 50 and the other parts. FIG. 4 schematically illustrates the position relation among the parts when the connector base 20 is pulled out of the enclosure 10 and the ground wire 50 is fully stretched while the relay cable 32 is not.

It is assumed that the connector base 20 retracted in the enclosure 10 is pulled out in the direction A, that is, in the positive X-axis direction in the drawing. The distance d1 is the distance from the wall surface of the enclosure 10 having the opening 10a to the fixture 50b of the ground wire 50, and the distance d2 is the distance from the wall surface of the enclosure 10 to a connector 100a to which the relay cable 32 is attached on the robot controller 100.

An imaginary line 321 is a straight line connecting between the attachment parts at both ends of the relay cable 32. The length L1 and L2 are the lengths of the ground wire 50 and the relay cable 32, respectively. The angle θ11 and angle θ21 are the angles that the ground wire 50 and the imaginary line 321, respectively, form with the XY-plane in the drawing. The angle θ12 and angle θ22 are angles that the projection lines of the ground wire 50 and the imaginary line 321 onto the XY-plane in the drawing, respectively, form with the X-axis in the drawing.

Under the foregoing conditions, when projected onto the X-axis in the drawing, the lengths of the ground wire 50 and the relay cable 32 assumed to be stretched along the imaginary line 321 are L1·cos θ11·cos θ12 and L2·cos θ21·cos θ22, respectively. Then, as illustrated in FIG. 4, for a state where only the ground wire 50 is fully stretched, the following Formula (1) needs to be satisfied:

$$L1 \cdot \cos \theta 11 \cdot \cos \theta 12 - d1 < L2 \cdot \cos \theta 21 \cdot \cos \theta 22 - d2 \qquad (1)$$

In other words, if Formula (1) is satisfied, when the connector base 20 is pulled out, the ground wire 50 fully stretched while the relay cable 32 is not prevents the relay cable 32 from being pulled out further. Then, having an extra length along the imaginary line 321 and receiving no tensile tension when the ground wire 50 is fully stretched, the relay cable 32 is prevented from being broken.

By setting L1 to be a certain value or less that satisfies Formula (1) and restricting the pull-out amount of the connector base 20 to be a certain amount or less, a break in the relay cable 32 caused by pinching is prevented. For the enclosure 10, for example, by setting the L1·cos θ11·cos θ12 to be nearly zero or a negative value with Formula (1) satisfied, the gap between the opening 10a and the connector base 20 when the connector base 20 is fully pulled out disappears. This prevents the relay cable 32 from being exposed outside the enclosure 10, thereby avoiding the relay cable 32 from being pinched when the connector base 20 is pulled out or retracted.

Thus, when the length of the ground wire 50 is determined so that a predetermined condition is satisfied, a break in the relay cable 32 caused by pulling and pinching is prevented. Thus, in the enclosure 10 according to the present embodiment, the ground wire 50 used in view of electric shock prevention is also provided with a role as the pull-out amount restricting member for the connector base 20. Depending on the positions of the heat exchanger 11, the robot controller 100, the connector 100a on the robot controller 100, and the like, the pull-out direction of the connector base 20, or the like, the length of the ground wire 50 is appropriately changed.

Figure 5:
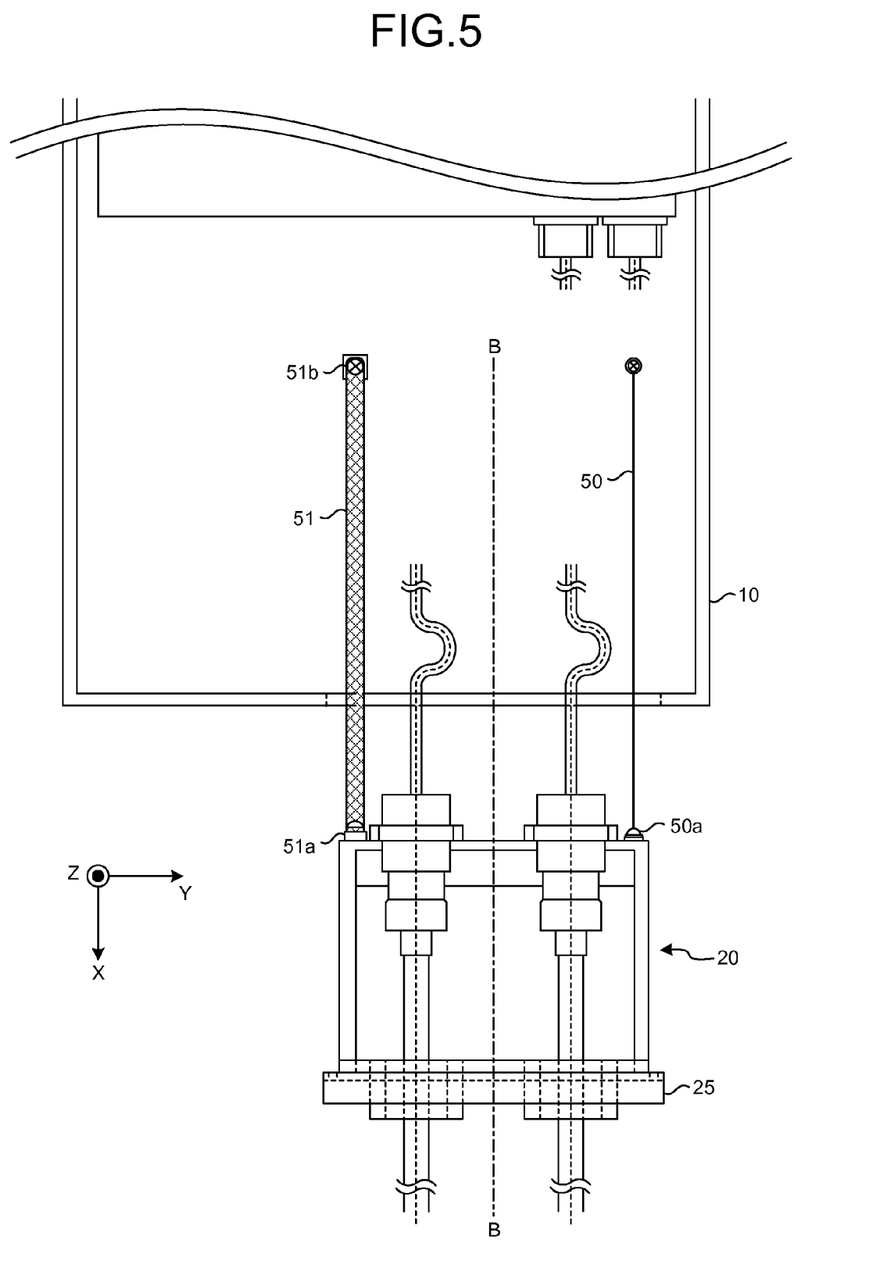
FIG. 5 is a diagram illustrating a modification of a pull-out amount restricting member.

Next, a modification of the pull-out amount restricting member will be described with reference to FIG. 5. FIG. 5 is a diagram illustrating the modification of the pull-out amount restricting member. The drawing illustrates an example where the pull-out amount of the connector base 20 is restricted by the ground wire 50 and a predetermined coupling member 51. FIG. 5 illustrates a state where the connector base 20 is pulled out of the enclosure 10.

As illustrated in FIG. 5, the coupling member 51 has the same length as the ground wire 50 and is fixed to the enclosure 10 and the connector base 20 through a fixture 51a and a fixture 51b, respectively. The fixture 51a and the fixture 51b are preferably, for example, screws in view of mechanical strength and operational convenience. The coupling member 51 and the ground wire 50 are arranged spaced apart from each other symmetrically with respect to a plane B that passes through the opening surface of the connector base 20, is perpendicular to the surface, and is parallel to the XZ-plane in the drawing.

The coupling member 51, as long as it is wire-like, may be formed of any material that has high tensile strength in the wire direction, flexibility, and no elasticity. It may be, for example, the same as the ground wire 50. A member having a structure of a rail, a stretchable shaft, or the like may be used. A case where a wire-like member is used will be described.

When the connector base 20 is pulled out of the enclosure 10, the symmetrically arranged coupling member 51 and ground wire 50 are fully stretched simultaneously, and the connector base 20 is supported at multiple points. When supported at multiple points, the connector base 20 is prevented from rotating about the wire direction of the ground wire 50 and rotating with the center being the fixture 50a and the radius being the length from the fixture 50a to the position where the lid 25 is supported. Consequently, the attitude is stabilized. The stabilization of the attitude of the connector base 20 by the multi-point support is obtained for any pull-out direction of the connector base 20 depending on the installation direction of the enclosure 10.

Thus, the enclosure illustrated in FIG. 5 includes, in addition to the ground wire 50, the coupling member 51 that has the same length as the ground wire 50 and is arranged spaced apart therefrom symmetrically with respect to the plane perpendicular to the opening surface of the connector base 20. This allows the connector base 20, when it is fully pulled out, to be supported at the multiple points, stabilizes its attitude, and prevents a break in the relay cable 32 caused by pulling due to the rotation of the connector base 20. Either one of or both of the ground wire 50 and the coupling member 51 may be provided plurally.

Figure 6:
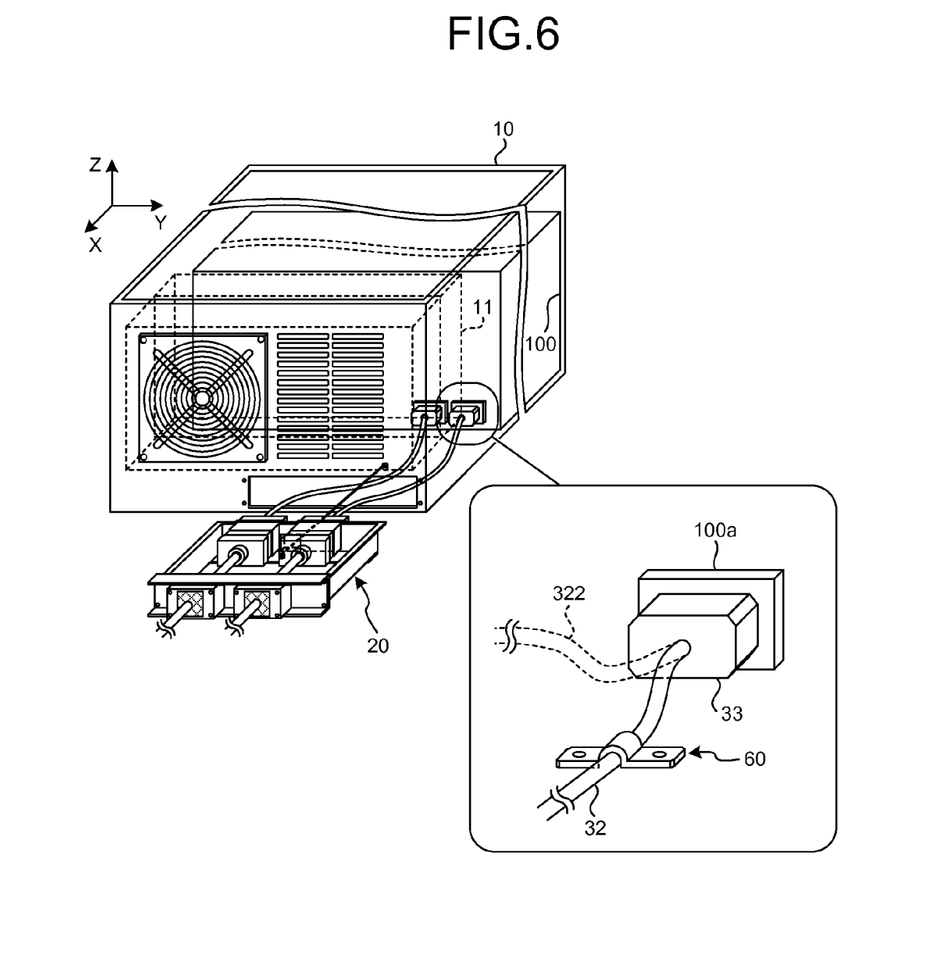
FIG. 6 is a diagram illustrating an installation example of a fixture.

Next, a fixture 60 of the relay cable 32 will be described with reference to FIG. 6. FIG. 6 is a diagram illustrating an installation example of the fixture 60, and in view of making the description easy to understand, illustrates the enclosure 10 with part of the external wall thereof made transparent.

Each of the relay cables 32 can move with a connecting point with the connector 33 as the fulcrum. A cable 322 indicated by broken lines in FIG. 6 schematically illustrates that the relay cable 32 can move. Because these relay cables 32 move in this way, they are expected to be lifted in the Z-axis direction in the drawing, to be twisted, and to get entangled with each other, when the connector base 20 is put in and taken out.

Then, as illustrated in FIG. 6, with the fixture 60 that holds the relay cable 32 inside the enclosure 10 provided, the movement of the relay cables 32 can be suppressed. The fixture 60 includes a holding part that holds the relay cable 32 and a fixing part that fixes the fixture 60 to the inside of the enclosure 10. The fixture 60 may be, for example, a cable tie made of synthetic resin such as polyethylene, polypropylene, and nylon or a metallic member such as iron.

The holding part holds the relay cable 32, fixes the relay cable 32 to the holding part, and prevents the rotational movement of the relay cable 32 about the wire direction. The fixing part fixes the holding part to the wall surface of the enclosure 10. Although the fixing manner of the fixing part is not limited, screws are preferable in view of mechanical strength and operational convenience.

As illustrated in FIG. 6, the fixture 60 is arranged inside the enclosure 10 near the connecting part between the connector 33 and the connector 100a. Depending on the position relation among the connector base 20, the connector 100a, or the like, the fixture 60 may also be fixed to any part other than the wall surface of the enclosure 10. The relay cable 32 is fixed near the connecting part between the connector 33 and the connector 100a with the fixture 60, thereby cutting off, at the holding part, a force caused by the uncontrolled movement of the relay cable 32.

In other words, the force caused by the uncontrolled movement of the relay cable 32 does not act on the connector 33, and the disconnection of the connector 33 from the connector 100a is prevented. Owing to the fixture 60, the holding part as a fixed point near the wall surface serves as the fulcrum of the flexural movement of the relay cable 32 when the connector base 20 is put in and taken out. The holding part prevents the lifting of the relay cable 32 from the wall surface caused when the connector base 20 is put in and taken out, making the relay cables 32 less likely to be twisted and to get entangled with each other.

The fixture 60 thus prevents the disconnection of the connector 33 or the like caused by vibrations and a break in the relay cables 32 caused by the entanglement and twisting of the relay cables 32, whereby the connector base 20 is smoothly put in and taken out. Depending on the positions of the heat exchanger 11, the robot controller 100, the connector 100a on the robot controller 100, and the like, the pull-out direction of the connector base 20, or the like, the position and the number of the fixture 60 for the relay cable 32 may be appropriately changed.

As described above, the enclosure according to the embodiment includes the internal space, the openings, the connector base, and the relay cables. The internal space accommodates the robot controller. The openings are formed in part of the external wall having predetermined environmental resistance. The connector base can be pulled out of the enclosure, includes the relay connector (the first connector) for connecting the external cable for the robot controller, and has a shape that covers the opening in the retracted state. The relay cable connects the second connector as the connector of the robot controller and the relay connector. The relay cable has a length that allows the connecting part between the relay connector and the external cable is exposed outside the enclosure with the connector base being pulled out.

The enclosure according to the embodiment can therefore allow easy and secure connection of the cable from the outside of the enclosure to the robot controller incorporated in the enclosure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An enclosure comprising:
   an internal space that accommodates therein a robot controller;
   an opening that is formed in part of an external wall having predetermined environmental resistance;
   a pull-out connector base that comprises a first connector for connecting an external cable for the robot controller and closes the opening in a retracted state; and
   a relay cable that connects a second connector as a connector of the robot controller and the first connector,
   wherein the relay cable has a length that allows a connecting part between the first connector and the external cable to be exposed outside the external wall when the pull-out connector base is pulled out, wherein the enclosure further comprises a ground wire whose base end is fixed to an internal surface of the external wall and the other end is connected to the pull-out connector base, and wherein the ground wire has a length that allows the ground wire to be fully stretched while the relay cable is not when the pull-out connector base is pulled out.

2. The enclosure according to claim 1, wherein the pull-out connector base has a nearly rectangular frame body in the top view.

3. The enclosure according to claim 2, wherein
the pull-out connector base further comprises a lid that closes the opening in the retracted state,
the first connector is provided on a side of the frame body on the robot controller side,
the lid is provided on a side opposite the side on the robot controller side, and
the lid comprises first sealing members that maintain sealability between the external cable connected to the first connector and the lid.

4. The enclosure according to claim 3, wherein the lid is formed by bending both long sides of a rectangular metallic plate in the same direction along a line by a certain distance from the sides, and the lid has a surface opposite the bending direction that makes contact with the external wall in the retracted state.

5. The enclosure according to claim 3, wherein the lid further comprises a second sealing member on a part that is in close contact with the external wall in the retracted state.

6. The enclosure according to claim 4, wherein the lid further comprises a second sealing member on a part that is in close contact with the external wall in the retracted state.

7. The enclosure according to claim 1, further comprising a fixture that fixes the relay cable to the internal surface of the external wall near the second connector.

8. An enclosure comprising:
an internal space that accommodates therein a robot controller;
an opening that is formed in part of an external wall having predetermined environmental resistance;
a pull-out connector base that comprises a first connector for connecting an external cable for the robot controller and closes the opening in a retracted state; and
a relay cable that connects a second connector as a connector of the robot controller and the first connector,
wherein the relay cable has a length that allows a connecting part between the first connector and the external cable to be exposed outside the external wall when the pull-out connector base is pulled out,
wherein the pull-out connector base has a nearly rectangular frame body in the top view,
wherein the pull-out connector base further comprises a lid that closes the opening in the retracted state,
wherein the first connector is provided on a side of the frame body on the robot controller side,
wherein the lid is provided on a side opposite the side on the robot controller side,
wherein the lid comprises first sealing members that maintain sealability between the external cable connected to the first connector and the lid, and
wherein the lid is formed by bending both long, sides of a rectangular metallic plate in the same direction along a line by a certain distance from the sides, and the lid has a surface opposite the bending direction that makes contact with the external wall in the retracted state.

9. The enclosure according to claim 8, wherein the lid further comprises a second sealing member on a part that is in close contact with the external wall in the retracted state.

10. The enclosure according to claim 8, further comprising a fixture that fixes the relay cable to the internal surface of the external wall near the second connector.

* * * * *